(12) United States Patent
Nakano

(10) Patent No.: US 6,538,489 B2
(45) Date of Patent: Mar. 25, 2003

(54) CLOCK DISTRIBUTING CIRCUIT IN PROGRAMMABLE LOGIC DEVICE

(75) Inventor: Hirotaka Nakano, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/819,791

(22) Filed: Mar. 29, 2001

(65) Prior Publication Data
US 2001/0035782 A1 Nov. 1, 2001

(30) Foreign Application Priority Data
Mar. 30, 2000 (JP) ........................................ 2000-093234

(51) Int. Cl.[7] ................................................ G06F 1/04
(52) U.S. Cl. ...................... 327/297; 327/296; 327/293; 326/28
(58) Field of Search ................................ 327/165, 166, 327/291, 292, 293, 294, 295, 296, 297, 415, 416, 417; 326/37, 38, 93

(56) References Cited

U.S. PATENT DOCUMENTS

| | | | | |
|---|---|---|---|---|
| 5,254,886 A | * | 10/1993 | El-Ayat et al. | 326/41 |
| 5,391,942 A | * | 2/1995 | El-Ayat et al. | 326/39 |
| 5,528,170 A | * | 6/1996 | Britton et al. | 326/41 |
| 5,705,942 A | * | 1/1998 | Ashuri | 326/93 |
| 5,712,579 A | * | 1/1998 | Duong et al. | 326/93 |
| 5,721,886 A | * | 2/1998 | Miller | 395/551 |
| 6,008,666 A | * | 12/1999 | Conn | 326/39 |

* cited by examiner

Primary Examiner—Timothy P. Callahan
Assistant Examiner—Hai L. Nguyen
(74) Attorney, Agent, or Firm—Sughrue Mion, PLLC

(57) ABSTRACT

One clock is selected from a plurality of clocks by a selector through programming. Clock lines are connected to the outputs of clock buffers connected to the selector. Programmable connector elements are connected onto these lines, and flip-flops and regulation loads are connected thereto. The programmable connector elements are selected through programming. This construction can realize a clock distributing circuit in a programmable logic device, which can suppress an increase in skew and can reduce a clock line wiring area.

5 Claims, 6 Drawing Sheets

10: SELECTOR
11: SELECTOR
16: CLOCK LINE
17: CLOCK LINE
18a – 18f: BUFFER
19a, 19b: CLOCK LINE
20a, 20b: PROGRAMMABLE CONNECTOR ELEMENT
21a, 21b: PROGRAMMABLE CONNECTOR ELEMENT
22a, 22b: PROGRAMMABLE CONNECTOR ELEMENT
23a, 23b: PROGRAMMABLE CONNECTOR ELEMENT
24a, 24b: PROGRAMMABLE CONNECTOR ELEMENT
25a, 25b: CLOCK LINE
26a, 26b: PROGRAMMABLE CONNECTOR ELEMENT
27a, 27b: PROGRAMMABLE CONNECTOR ELEMENT
28a, 28b: PROGRAMMABLE CONNECTOR ELEMENT
29a, 29b: PROGRAMMABLE CONNECTOR ELEMENT
30a, 30b: PROGRAMMABLE CONNECTOR ELEMENT
31a, 31b: CLOCK LINE
32a, 32b: PROGRAMMABLE CONNECTOR ELEMENT
33a, 33b: PROGRAMMABLE CONNECTOR ELEMENT
34a, 34b: PROGRAMMABLE CONNECTOR ELEMENT
35a, 35b: PROGRAMMABLE CONNECTOR ELEMENT
36a, 36b: PROGRAMMABLE CONNECTOR ELEMENT
37 – 45: FLIP-FLOP
81 – 83: LOAD
91 – 93: LOAD
201a – 201d: CLOCK LINE
CLK: CLOCK

10: SELECTOR
12a, 12b: PROGRAMMABLE CONNECTOR ELEMENT
14: VDD LINE
15: GND LINE
102: TRANSISTOR
104: TRANSISTOR
VDD: POWER LINE
GND: GRAND

CLOCK DISTRIBUTING CIRCUIT IN PROGRAMMABLE LOGIC DEVICE

FIELD OF THE INVENTION

The invention relates to a clock distributing circuit in a programmable logic device (PLD), and more particularly to a clock distributing circuit in a programmable logic device wherein several types of clocks are input into one chip.

BACKGROUND OF THE INVENTION

A programmable logic device (PLD) is a logic LSI such that a user can program (externally set or rewrite) a combination of a plurality of logic circuits to obtain a necessary logical function. In recent years, a significant increase in scale of gates has made it possible to realize a circuit on a system level by a programmable logic device having a one-chip construction. For this reason, it is common practice to input several types of clocks into one chip.

The distribution of clocks in the programmable logic device has been performed through specialty wiring for speed increase purposes. An increase in the number of clocks, however has led to an increase in clock wiring area which is becoming an obstacle to an improvement in integration density and performance of devices.

FIG. 5 shows a first example of the conventional clock distributing circuit for a programmable logic device.

The clock distributing circuit shown in FIG. 5 has a construction such that clock lines 201a, 201b, 201c, 201d respectively for a plurality of clocks (CLK-A, CLK-B, CLK-C, CLK-D) are wired in a plurality of routes (3 routes in this case), and clock buffers 202a to 202l are connected to the inlets of the routes. Selectors 204a to 204c are connected to clock lines 203a to 203d for the clock buffers 202a to 202d, selectors 204d to 204f are connected to clock lines 203e to 203h, and selectors 204g to 204i are connected to clock lines 203i to 203l. Further, flip-flops (FFs) 205a to 205i as logic circuits are connected to selectors 204a to 204i. A user controls the selectors 204a to 204i through a program, inputs one clock selected from four clocks in each of selectors 204a to 204i into respective flip-flops 205a to 205i. Flip-flops operated by a common clock on a common clock line constitute one logic circuit.

FIG. 6 shows a second example of the conventional clock distributing circuit for a programmable logic device.

According to the construction of this clock distributing circuit clocks can be fed to flip flops without use of separate selectors. This clock distributing circuit is described in more detail in Japanese Patent Laid-Open No. 120811/1994. In this construction, programmable connector elements are used instead of the selectors 204a to 204i shown in FIG. 5. Specifically, connector elements 206a to 206d are used instead of the selector 204a, connector elements 207a to 207d are used instead of the selector 204b, connector elements 208a to 208d are used instead of the selector 204c, connector elements 209a to 209d are used instead of the selector 204d, connector elements 210a to 210d are used instead of the selector 204e, connector elements 211a to 211d are used instead of the selector 204f, connector elements 212a to 212d are used instead of the selector 204g, connector elements 213a to 213d are used instead of the selector 204h, and connector elements 214a to 214d are used instead of the selector 204i.

Each of the connector elements 206a to 214d comprises a memory cell for holding program data and a transistor which functions as a switching element. When only one of the connector elements 206a to 206d is turned on, only one clock selected from CLK-A to CLK-D is input into the corresponding flip-flop. This is true of the connector elements 207a to 207d, 208a to 208d, 209a to 209d, 210a to 210d, 211a to 211d, 212a to 212d, 213a to 213d, and 214a to 214d.

In the prior art a plurality of circuits for incorporating clocks into clock feed means, such as clock buffers, are present in a programmable logic device. Further, it is known that, for each of the circuits, when the wiring length between the circuit and the clock feed means is not identical, a phenomenon called "clock skew" takes place wherein a difference in clock arrival time occurs. The clock skew becomes more significant with increasing the clock rate and with increasing the programmable array density, and is an obstacle to an increase in speed of logical operation. For this reason, the clock skew should be minimized.

The circuits shown in FIGS. 5 and 6 will be reviewed. In the construction shown in FIG. 5, selectors are provided close to respective flip-flops, and all the clock lines are connected to the selectors. Therefore, the clock skew is small. Since, however, this construction requires wiring of all the clock lines, the clock line wiring area is large. On the other hand, in the construction shown in FIG. 6, each flop-flop is connected to four clock lines (such as 203a to 203d) through a single clock incorporation line. This can reduce the necessary area for wiring between four clock lines and each flip-flop, but on the other hand, the clock skew is increased.

Several proposals have hitherto been made as means for reducing clock skew. For example, Japanese Patent Laid-Open No. 317457/1999 proposes a method wherein in addition to a basic logic circuit, a dummy load is connected to the output side of a clock driver as clock feed means, the minimum dummy load capacity necessary for equalizing the total load of clock signals is calculated for each circuit arrangement area, and this is disposed in the circuit arrangement area, and, in addition, clock wiring and signal wiring are performed to connect the basic logic circuit to the dummy load.

According to the conventional clock distributing circuit in a programmable logic device (PLD) in PLDs having constructions shown in FIGS. 5 and 6, a plurality of clock lines corresponding to the number of clocks are wired so as to spread to all the flip-flops. This increases the wiring area for clock lines and thus limits the space for mounting elements.

Further, the method disclosed in Japanese Patent Laid-Open No. 317457/1999 requires high accuracy on the distance to each clock driver and, in addition, requires high accuracy on the distance to circuits behind the clock drivers. Therefore, the degree of freedom is low. Further, in this method. the total number (N) of circuits connected to the clock driver (flip-flops+dummy loads) is made constant so that N circuits are equally connected to each clock driver. This method, however, is not intended for PLD and a plurality of clocks. Therefore, it is difficult to apply this technique to circuits having a construction using PLD and a plurality of clocks such that, in elements wherein a plurality of clock signal distribution paths are not even, a user controls connector elements through programming.

SUMMARY OF THE INVENTION

Accordingly, it is an object of the invention to provide a clock distributing circuit in a programmable logic device which can reduce the necessary wiring area for clock lines.

It is another object of the invention to provide a clock distributing circuit in a programmable logic device which can reduce the necessary wiring area for clock lines and, in addition, can suppress an increase in skew.

According to the first feature of the invention, a clock distributing circuit in a programmable logic device (PLD), for selecting one clock from a plurality of clocks and then feeding the selected clock to a plurality of logic circuits, comprises:

- a clock generation source for generating the plurality of clocks;
- select signal generation means for generating a select signal for selecting one clock from the plurality of clocks based on a program; and
- a selector for selecting one clock from the plurality of clocks based on the select signal and feeding the selected clock to logic circuits selected from the plurality of logic circuits.

According to this construction, a select signal in selecting one of a plurality of clocks is generated by a select signal generation means, and, in response to this select signal, a selector selects one clock from the plurality of clocks. This can reduce the number of clock lines for feeding clocks to a plurality of logic circuits and thus can reduce the necessary wiring area for clock lines.

According to the second feature of the invention, a clock distributing circuit in a programmable logic device (PLD), which, through programming, can combine a plurality of logic circuits and can select one clock from a plurality of clocks and feed the selected clock to the plurality of logic circuits, comprises:

- a selector which selects one clock from the plurality of input clocks through the programming and outputs the selected clock;
- a plurality of buffer circuits for distributing the clock sent from the selector to a plurality of clock lines to which the plurality of logic circuits are distributively connected;
- a plurality of first programmable connector elements for connecting a logic circuit as a connect object in the plurality of logic circuits to one of the plurality of clock lines according to the programming;
- a plurality of regulation loads connectable to the plurality of clock lines; and
- a plurality of second programmable connector elements for connecting the plurality of regulation loads to one of the plurality of clock lines according to the number of logic circuits, in the plurality of logic circuits, connected to the plurality of clock lines.

According to this construction, the clock required by a logic circuit is selected by a selector from a plurality of input clocks, and the clock output from the selector is sent to a plurality of clock lines through a plurality of buffer circuits, and is further sent to a plurality of logic circuits through a first programmable connector element which is operated through programming. Further, according to the status of the connection of the logic circuit to the clock line, a plurality of regulation loads are connected through a plurality of second programmable connector elements to equalize the delay time of the clocks in a plurality of clock lines. This can suppress an increase in clock skew, and, in addition, can reduce the necessary wiring area for clocks.

BRIEF DESCRIPTION OF THE DRAWINGS

The invention will be explained in more detail in conjunction with the appended drawings, wherein.

DESCRIPTION OF THE PREFERRED EMBODIMENTS

Preferred embodiments of the invention will be explained in conjunction with the accompanying drawings.

Figure 1:
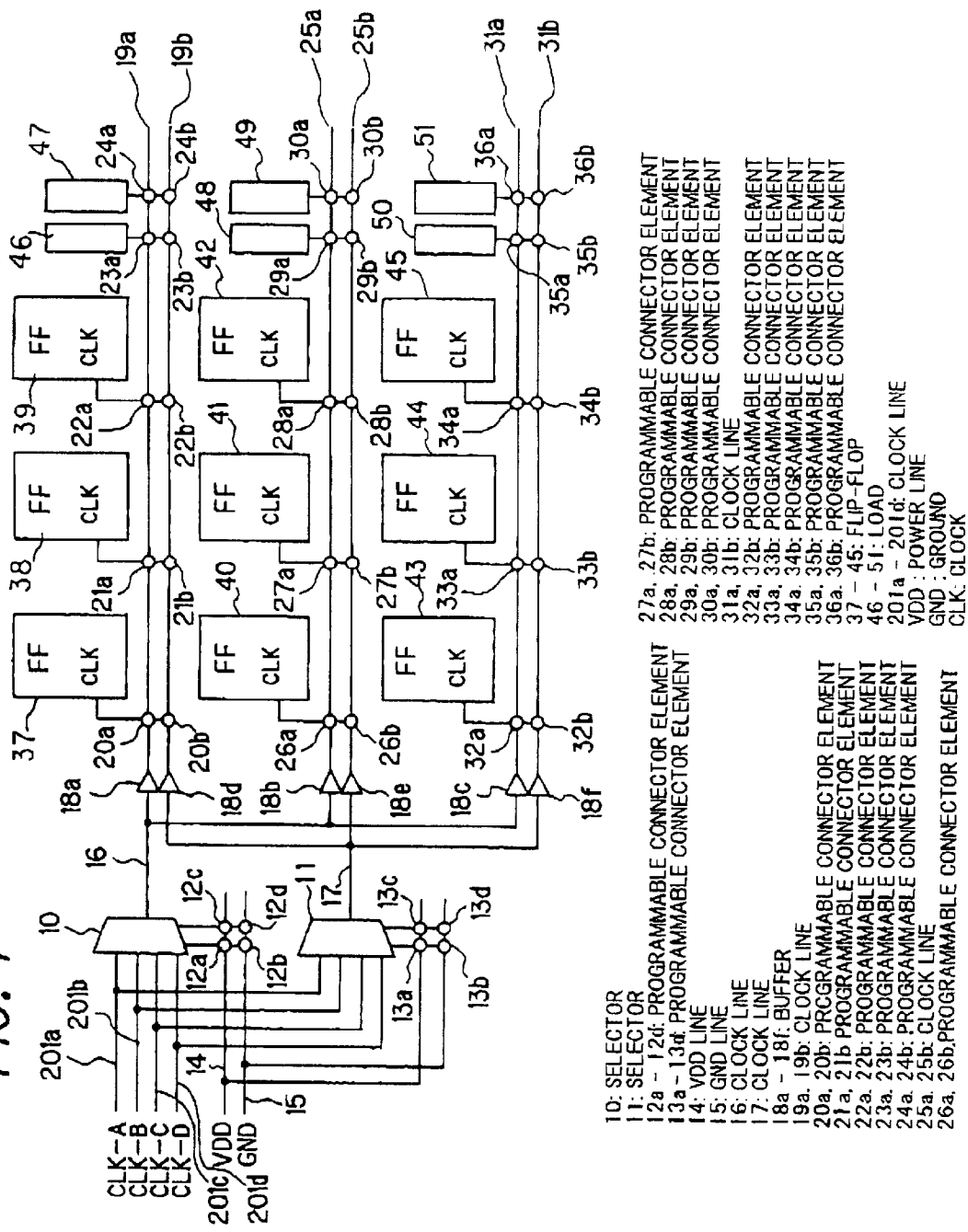
FIG. 1 is a circuit diagram showing a first preferred embodiment of the clock distributing circuit in a programmable logic device according to the invention.

FIG. 1 shows the first preferred embodiment of the clock distributing circuit in a programmable logic device according to the invention.

Selectors 10, 11 are connected to clock lines 201a, 201b, 201c, 201d respectively for a plurality of clocks (CLX-A, CLK-B, CLK-C, CLK-D). The selector 10 selects one of the clocks CLK-A to CLK-D based on the results of programming of programmable connector elements 12a, 12c connected to a power (VDD) line 14 and programmable connector elements 12b, 12d connected to a ground (GND) line 15. The selector 11 selects one of the clocks CLK-A to CLK-D based on the results of programming of programmable connector elements 13a, 13c connected to the power (VDD) line 14 and programmable connector elements 13b, 13d connected to the ground (GND) line 15. Clock buffers 18a, 18b, 18c are connected in parallel to a clock line 16 connected to an output terminal of the selector 10, and clock buffers 18d, 18e. 18f are connected in parallel to a clock line 17 connected to an output terminal of the selector 11.

Clock lines 19a, 19b are connected to the clock buffers 18a, 18d, programmable connector elements 20a, 21a, 22a, 23a, 24a are connected to the clock line 19a, and programmable connector elements 20b, 21b, 22b, 23b, 24b are connected to the clock line 19b. Likewise, clock lines 25a, 25b are connected to the clock buffers 18b, 18e, programmable connector elements 26a, 27a, 28a, 29a, 30a are connected to the clock line 25a, and programmable connector elements 26b, 27b, 28b, 29b, 30b are connected to the clock line 25b. Further, clock lines 31a, 31b are connected to the clock buffers 18c, 18f, programmable connector elements 32a, 33a, 34a, 35a, 36a are connected to the clock line 31a, and programmable connector elements 32b, 33b, 34b, 35b, 36b are connected to the clock line 31b.

A flip-flop 37 as a logic circuit is connected to the programmable connector elements 20a, 20b, a flip-flop 38 is connected to the programmable connector elements 21a, 21b, and a flip-flop 39 is connected to the programmable connector elements 22a, 22b. Further, a regulation load 46 is connected to the programmable connector elements 23a, 23b, and a regulation load 47 is connected to the programmable connector elements 24a, 24b.

Likewise a flip-flop 40 is connected to the programmable connector elements 26a, 26b, a flip-flop 41 is connected to the programmable connector elements 27a, 27b, a flip-flop 42 is connected to the programmable connector elements 28a, 28b, a regulation load 48 is connected to the programmable connector elements 29a, 29b, and a regulation load 49 is connected to the programmable connector elements 30a, 30b.

Further, a flip-flop 43 is connected to the programmable connector elements 32a, 32b, a flip-flop 44 is connected to the programmable connector elements 33a, 33b, a flip-flop 45 is connected to the programmable connector elements 34a, 34b, a regulation load 50 is connected to the programmable connector elements 35a, 35b, and a regulation load 51 is connected to the programmable connector elements 36a, 36b. The regulation loads 46 to 51 have the same load capacity as the flip-flops 37 to 45, and function to regulate the load of the clock lines 19a, 19b, 25a, 25b, 31a, 31b.

Figure 2:
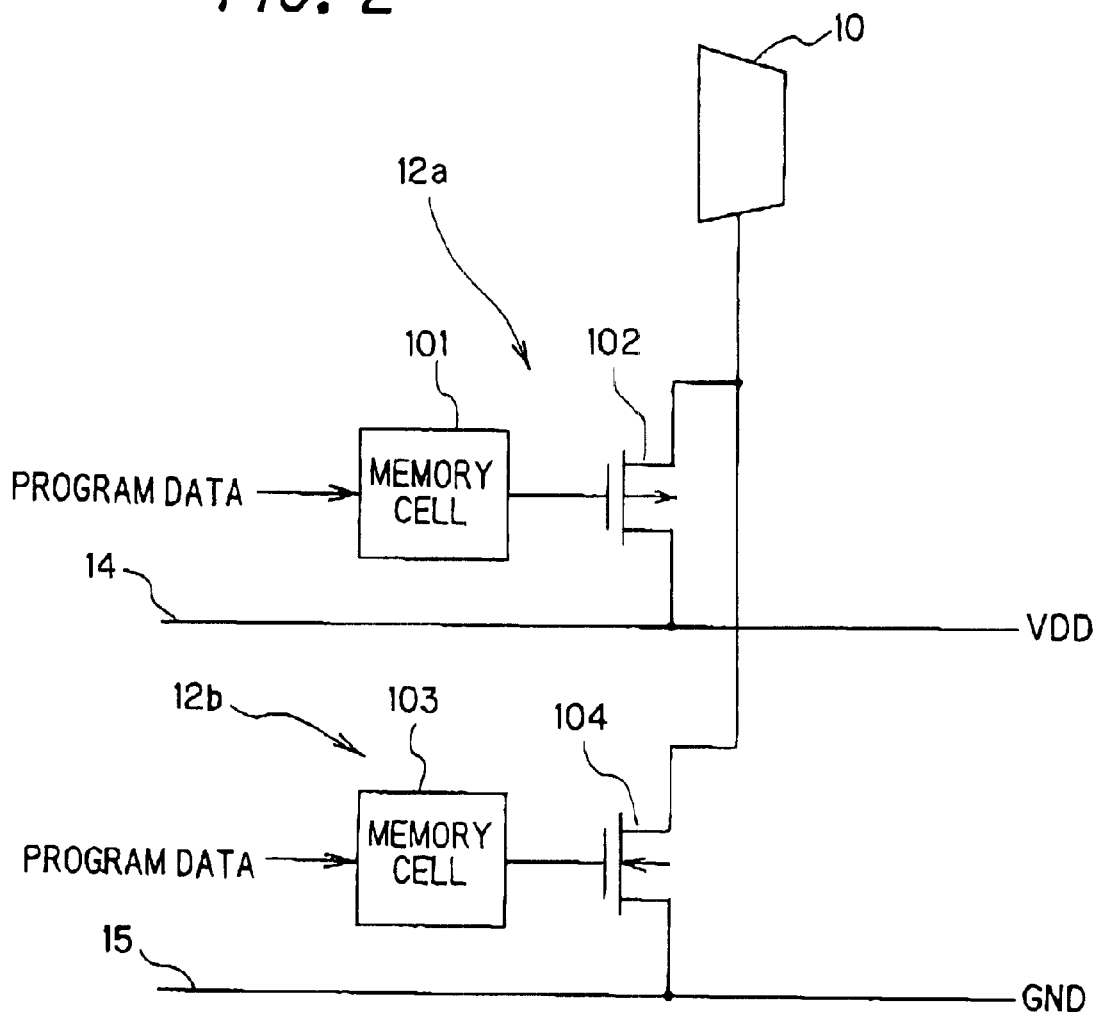
FIG. 2 is a circuit diagram showing the detailed construction of programmable connector elements shown in FIG. 1.

FIG. 2 shows the detailed construction of programmable connector elements. Since the programmable connector elements 12a to 13d, 20a to 24b, 26a to 29b, 32a to 36b shown in FIG. 1 have an identical construction, only the programmable connector elements 12a, 12b are shown in the drawing, and will be explained here.

The programmable connector element 12a comprises: a memory cell 101 into which program data is input; and a transistor 102 which is turned ON or OFF in response to a signal output from this memory cell 101. Likewise, the programmable connector element 12b comprises: a memory cell 103 into which program data is input; and a transistor 104 which is turned ON or OFF in response to a signal output from this memory cell 103, P-type and N-type MOSPETs are used in the transistors 102 and 104. The transistor 102 in its source and the transistor 104 in its drain are connected to the selector 10. The transistor 102 in its drain is connected to the power (VDD) line 14, and the transistor 104 in its source is connected to the ground (GND) line 15.

Program data is externally read at the time of initialization or reconfiguration of the programmable logic device, and is stored in the memory cells 101, 103. The memory cells 101. 103 are memory for storing information of one bit. The ON/OFF operation of the transistors 102, 104 is determined according to the information. When the transistor 102 is in ON state, the selector 10 is connected to the power (VDD) line 14, while when the transistor 102 is in OFF state, the selector 10 is not connected to the power (VDD) line 14. Likewise, when the transistor 104 is in ON state, the selector 10 is connected to the ground (GND) line 15, while when the transistor 104 is in OFF state, the selector 10 is not connected to the ground (GND) line 15. The regulation of program data sent to two sets of programmable connector elements 12a to 12d having the above construction permits the line of the selector 10 to be connected to either the power (VDD) line 14 or the ground (GND) line 15, or the line of the selector 10 to be unconnected to both the lines 14, 15.

Next, the operation of the clock distributing circuit having a construction shown in FIG. 1 will be explained.

As explained above in connection with FIG. 2, in addition to the control of the selectors 10, 11, the connection of the flip-flops 37 to 45 and the regulation loads 46 to 51 to the clock lines 19a, 19b, 25a, 25b, 31a, 31b are performed by controlling the programmable connector elements 20a to 36b based on the contents of a program prepared by the user.

The operation of the programmed state will be first explained. Two clocks output from the selectors 10, 11 are selected by the programmable connector elements 12a to 12d and 13a to 13d. The clocks sent from the selectors 10, 11 to the clock lines 16, 17 are distributed respectively to the clock lines 19a and 19b, the clock lines 25a and 25b, and the clock lines 31a and 31b through the clock buffers 18a to 18f. The flip-flops 37 to 45 each are connected by the programmable connector elements 20a to 22b, 26a to 28b, and 32a to 34b to two clock lines (19a and 19b, 25a and 25b, or 31a and 31b). The clock line, to which the flip-flop is connected, is determined by the program data given by the user. For some program, there is a flip-flop (unused flip-flop) into which both the clocks from the selectors 10, 11 are not input. This flip-flop is not connected to the clock line.

The regulation loads 46 to 51 each are connectable to two corresponding clock lines through the programmable connector elements 23a to 24b, 29a to 30b, and 35a to 36b, and, according to program data, is connected to one of the clock lines or is unconnected to both the clock lines. The load of the clock lines is equalized by connecting a desired number of regulation loads out of the regulation loads 46 to 51 to the clock lines.

Next, the operation of the selectors 10 and 11 will be explained. A signal for operating the selector is connected to the power (VDD) line 14 or the ground (GND) line 15 through the programmable connector elements 12a to 13d. The connection of the control terminals of the selectors 10 and 11 to the power (VDD) line 14 or the ground (GND) line 15 through the program data permits the selectors 10 and 11 to select one of the clocks CLK-A to CLK-D.

Here how to regulate program data for equalizing the load of the clock lines 19a to 31b will be explained. An example of the connection of circuits, which a user has desired, is as follows.

TABLE 1

| Clock line | Connected flip-flop |
|---|---|
| 19a | 37, 39 |
| 19b | 38 |
| 25a | 42 |
| 25b | 40, 41 |
| 31a | 44 |
| 31b | 43 |

(The flip-flop 45 is unconnected.)

In this case, when the regulation loads 46 to 51 are connected to the clock lines in the following manner, the load of the clock lines is equalized, resulting in reduced clock skew.

TABLE 2

| Clock line | Connected regulation load |
|---|---|
| 19a | Unconnected |
| 19b | 46 |
| 25a | 48 |
| 25b | Unconnected |
| 31a | 50 |
| 31b | 51 |

(The regulation loads 47 and 49 are unconnected to the clock lines.)

What is particularly important in the regulation of loads is to equalize the load of the clock lines 19a, 25a, 31a to which an identical clock is fed. A difference in load between clock lines leads to a difference in clock delay time between the clock lines and thus increases clock skew. For the same reason, the load should be equalized also in the other clock lines 19b, 25b, 31b.

The regulation of the load is performed using a development tool. In general, when the user constructs a desired circuit by PLD, a user circuit is allocated by the development tool of the device, for example, to each flip-flop within the device or the logical block to prepare program data. The load of each clock line is determined at a stage where the user has allocated the circuit. At that time, the connection of the regulation load is determined according to the status of the load in each clock line.

Even when the whole chip requires a considerably large number of types of clocks, in most cases, the necessary number of types of clocks is one or two in a limited certain partial area of the chip. Therefore, as shown in FIG. 1, the number of clock lines can be reduced by selecting a clock, to be fed to a certain partial area, by the selectors 10, 11 and feeding the clock to the area. This can reduce the clock wiring area.

A load balance between the clock lines is provided by regulating the number of connected regulation loads according to the number of flip-flops connected to the clock lines. Therefore, when the user programs a circuit, an increase in clock skew can be prevented even in the case where there is a difference in the number of flip-flops connected to the clock line between clock lines. Since the skew regulation load and the programmable connector element used to this end have a smaller area than the selector used in the conventional construction, the clock wiring area can be reduced. The reduction in the clock wiring area shortens the average wiring length between logical blocks and thus can shorten the delay time.

In the above preferred embodiment, the number of clocks used in a combination of logic circuits in PLD is two (output of the selector 10 and output of the selector 11). However, the number of clocks is not limited to two. It would be apparent to a person having ordinary skill in the art that, for example, when the number of clocks used in the combination of logic circuits is one, the effect of reducing the wiring area is larger, while, when the number of clocks used in a partial area is 3, the degree of freedom in the allocation of the user circuit can be increased.

Figure 3:
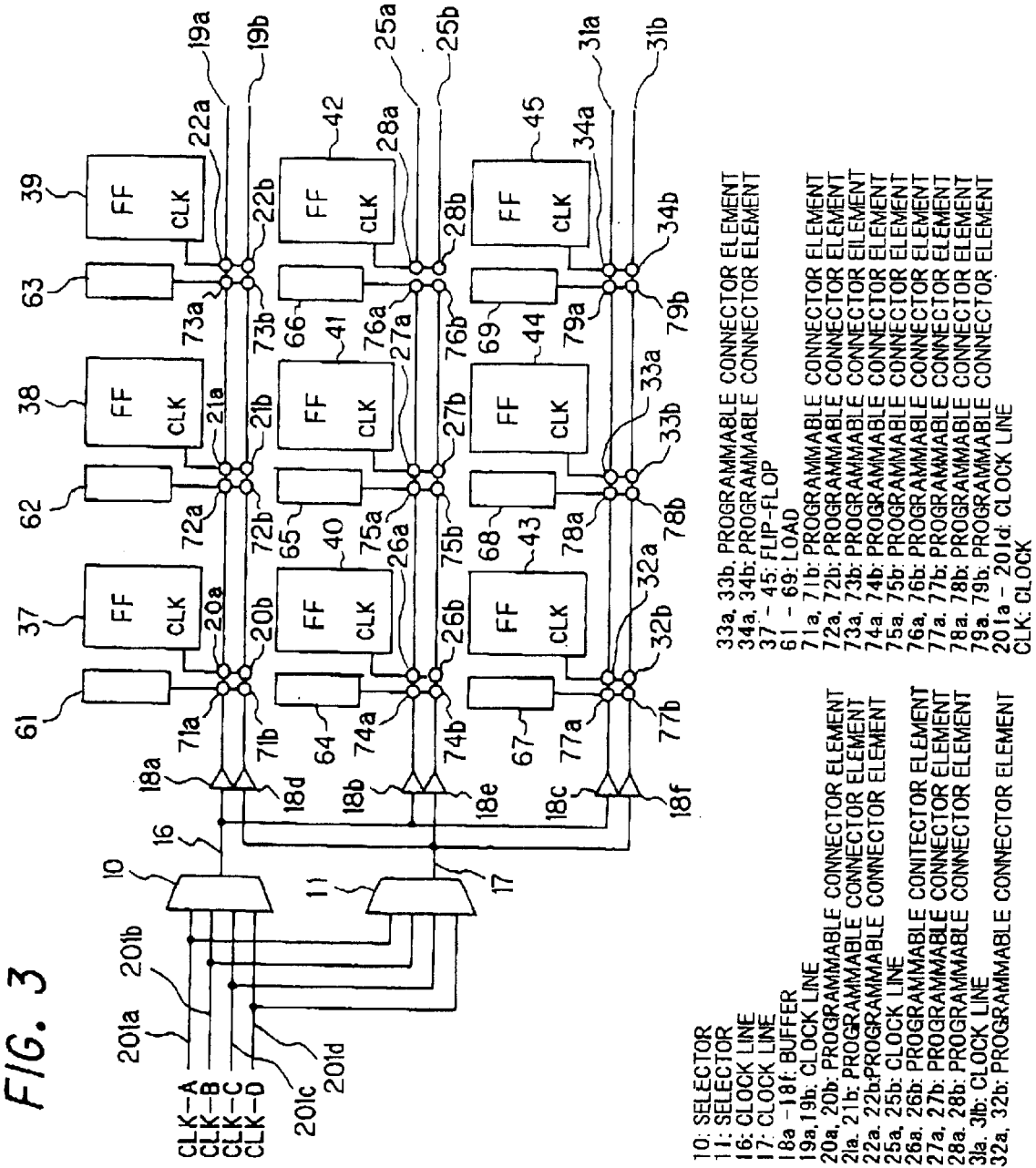
FIG. 3 is a circuit diagram showing a second preferred embodiment of the invention.

FIG. 3 shows the second preferred embodiment of the invention. In FIG. 3, the programmable connector elements 12a to 13d for the selectors 10. 11, the power (VDD) line 14, and the ground (GND) line 15 are not shown.

The second preferred embodiment is characterized in that, in the construction shown in FIG. 1, a one-to-one relationship between the regulation load and the flip-flop is used to constitute one basic cell. To clock lines, to which flip-flops 37 to 45 have been connected, and clock lines on the opposite side are connected regulation loads 61 to 69 having the same load capacity as the flip-flops. This can equalize the load of the clock lines. The regulation loads 61, 62, 63 are connected to the clock lines 19a, 19b through programmable connector elements 71a, 71b, 72a, 72b, 73a, 73b, the regulation loads 64, 65, 66 are connected to the clock lines 25a, 25b through programmable connector elements 74a, 74b, 75a, 75b, 76a, 76b, and the regulation loads 67, 68, 69 are connected to the clock lines 31a, 31b through programmable connector elements 77a, 77b, 78a, 78b, 79a, 79b.

The operation of the second preferred embodiment other than the load regulation method shown in FIG. 3 is the same as that of the first preferred embodiment shown in FIG. 1, and, thus, the explanation thereof will be omitted. For example, when the flip-flop 37 is connected to the clock line 19a, the regulation load 61 is connected to the clock line 19b. On the other hand, when the flip-flop 37 is connected to the clock line 19b, the regulation load 61 is connected to the clock line 19a. This can equalize the loads connected to the clock lines 16 and 17.

The second preferred embodiment is advantageous in that, since the position of the flip-flop is physically close to the position of the regulation load, the load can be easily equalized even in the case where the difference in delay time attributable to the difference in distance from the clock buffers 18a to 18f to the loads is not negligible.

Figure 4:
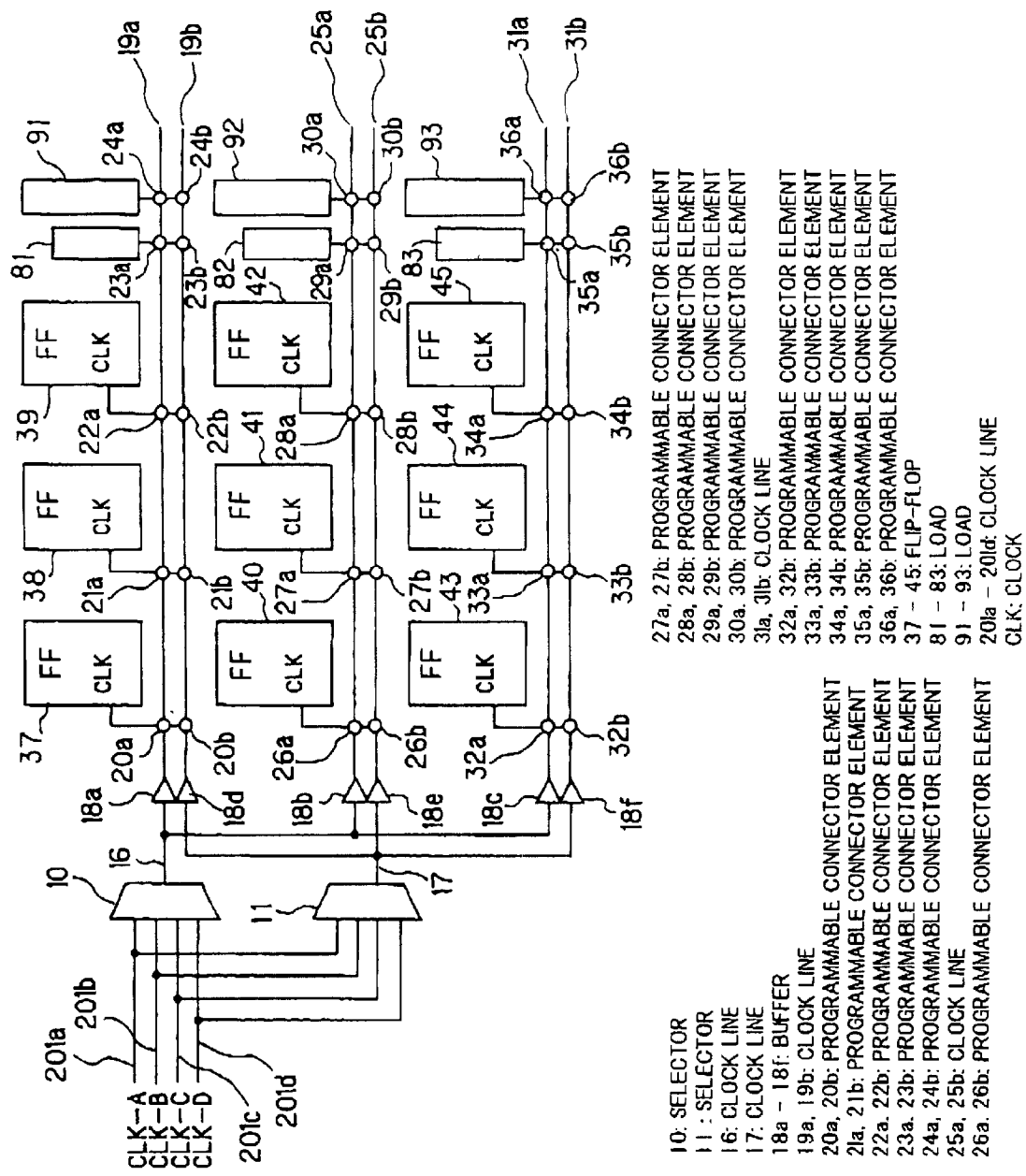
FIG. 4 is a circuit diagram showing a third preferred embodiment of the invention.
Figure 5:
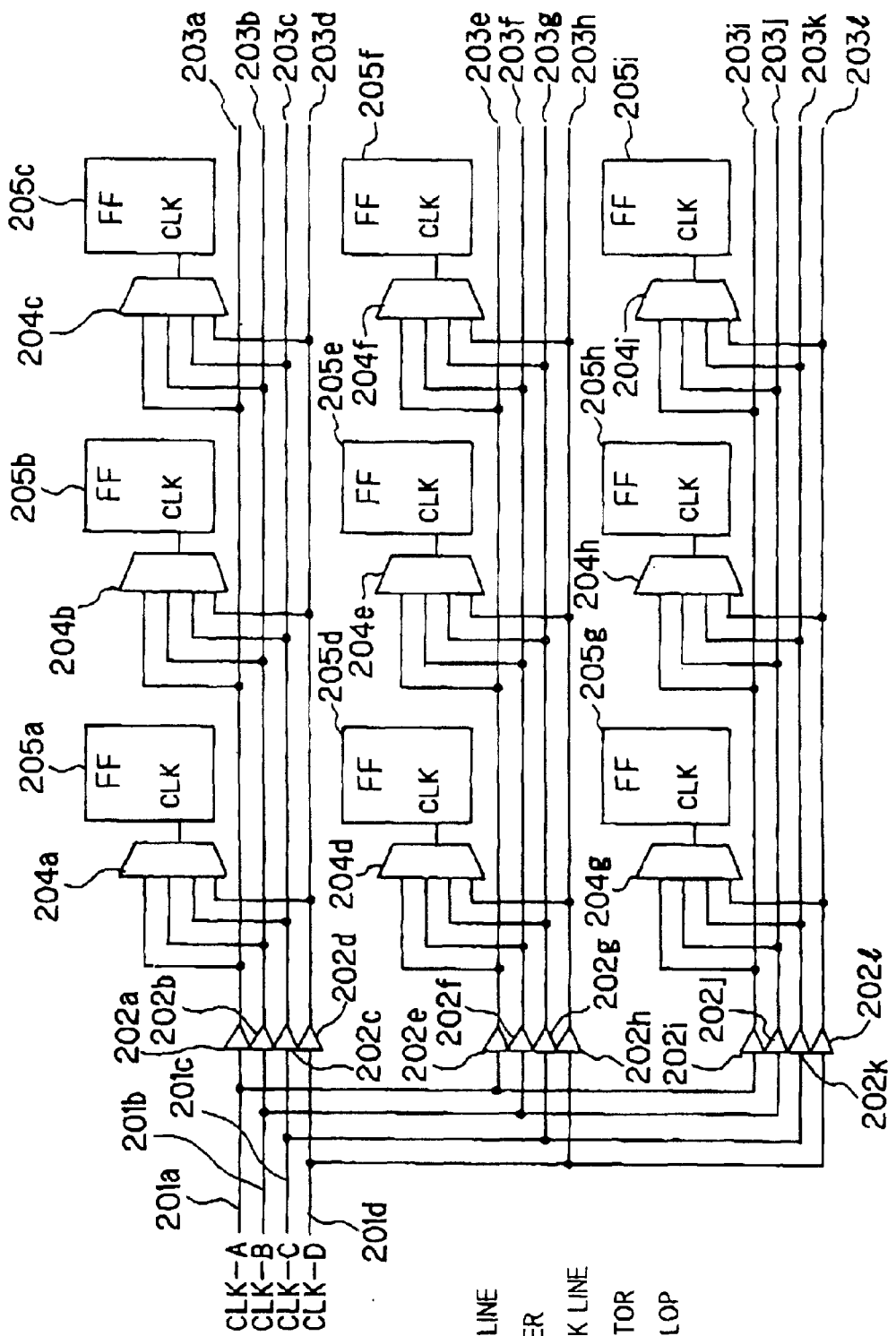
FIG. 5 is a circuit diagram showing a first example of the conventional clock distributing circuit in a programmable logic device.
Figure 6:
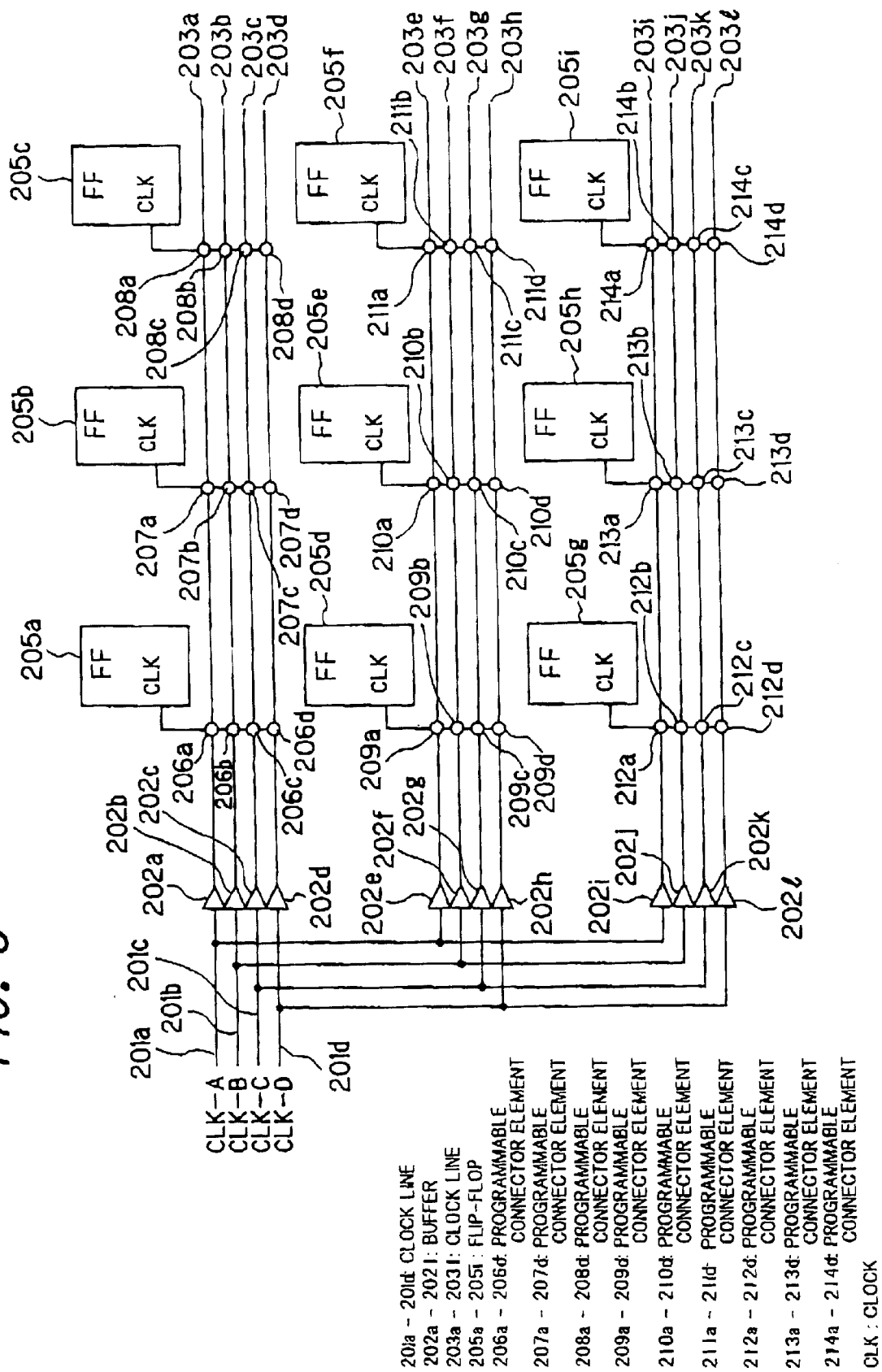
FIG. 6 is a circuit diagram shoving a second example of the conventional clock distributing circuit in a programmable logic device.

FIG. 4 shows the third preferred embodiment of the invention. In FIG. 4, the programmable connector elements 12a to 13d for the selectors 10, 11, the power (VDD) line 14, and the ground (GND) line 15 are not shown.

The third preferred embodiment is characterized in that, in the construction shown in FIG. 1, the capacity of the regulation load connected onto the clock line 19a is different from that of the regulation load connected onto the clock line 19b, the capacity of the regulation load connected onto the clock line 25a is different from that of the regulation load connected onto the clock line 25b, and the capacity of the regulation load connected onto the clock line 31a is different from that of the regulation load connected onto the clock line 31b. Specifically, the regulation loads 81, 82, 83 having the same load capacity as the flip-flops are provided instead of the regulation loads 46, 48, 50 shown in FIG. 1, and the regulation loads 91, 92, 93, of which the load capacity is twice that of the flip-flops, are provided instead of the regulation loads 47, 49, 51 shown in FIG. 1.

The operation of the third preferred embodiment other than the load regulation method is the same as that of the first preferred embodiment shown in FIG. 1, and, thus, the explanation thereof will be omitted. Here a method for regulating program data to equalize the load of the clock lines 9a to 31b will be explained. An example of the connection of circuits, which a user has desired, is as follows.

TABLE 3

| Clock line | Connected flip-flop |
| --- | --- |
| 19a | 37, 38, 39 |
| 19b | Unconnected |
| 25a | 40, 41 |
| 25b | 42 |
| 31a | 43 |
| 31b | 44, 45 |

In this case, regulation loads are connected to clock lines as shown in Table 4.

TABLE 4

| Clock line | Connected regulation load |
| --- | --- |
| 19a | Unconnected |
| 19b | 81, 91 |
| 25a | 92 |
| 25b | 92 |
| 31a | 93 |
| 31b | 93 |

In the third preferred embodiment of the invention, the provision of regulation loads having different capacities can reduce the area occupied by the regulation loads. Further, since the number of programmable connector elements connected to the clock lines can be reduced, the mounting area can be reduced. In particular, the area reduction effect is large when the number of flip-flops connectable to one clock line is large.

In the above-described preferred embodiments, three flip-flops at the maximum are allocated to each clock line, and the number of loads having an identical load capacity or the number of types of loads connectable to each clock line is 2, it would be needless to say that the number of flip-flops and the number of loads or the number of types of loads are not limited to those described in the preferred embodiments. Further, although four types of clocks have been used in the above preferred embodiments, any number of types of clocks may be used.

As is apparent from the foregoing description, the clock distributing circuit in a programmable logic device (PLD) according to the first feature of the invention, for selecting one of a plurality of clocks and then feeding the selected clock to a plurality of logic circuits, comprises: a clock generation source for generating the plurality of clocks; select signal generation means for generating a select signal for selecting one clock from the plurality of clocks based on a program; and a selector for selecting one clock from the plurality of clocks based on the select signal and feeding the selected clock to logic circuits selected from the plurality of logic circuits.

According to this construction, a select signal for selecting one of a plurality of clocks is generated by a select signal generation means, and, in response to this select signal, a selector selects one clock from the plurality of clocks. This can reduce the number of clock lines for feeding clocks to a plurality of logic circuits and thus can reduce the necessary wiring area for clock lines.

Further, as described above in the clock distributing circuit in a programmable logic device according to the second feature of the invention, one of a plurality of input clocks is selected by a selector, and is sent to a clock line. A plurality of logic circuits can be connected to this clock line through a first programmable connector element, and a regulation load can be connected to the above clock line through a second programmable connector element. By virtue of this construction, the reduction in the number of clock lines led to logic circuits can reduce the clock wiring area, and the selective connection of the regulation load by the second programmable connector element can eliminate the difference in delay time between clocks in a plurality of clock lines independently of the number of connected logic Circuits. This can suppress an load imbalance between clock lines and thus can suppress an increase in clock skew.

The invention has been described in detail with particular reference to preferred embodiments, but it will be understood that variations and modifications can be effected within the scope of the invention as set forth in the appended claims.

What is claimed is:

1. A clock distributing circuit in a programmable logic device (PLD), which, through programming, can select one clock from a plurality of clocks and feed the selected clock to a plurality of logic circuits, said clock distributing circuit comprising:

a selector which selects one clock from the plurality of input clocks through the programming and outputs the selected clock;

a plurality of buffer circuits for distributing the clock sent from the selector to a plurality of clock lines to which the plurality of logic circuits are distributively connected;

a plurality of first programmable connector elements for connecting a logic circuit as a connect object in the plurality of logic circuits to one of the plurality of clock lines according to the programming;

a plurality of regulation loads connectable to the plurality of clock lines; and a plurality of second programmable connector elements for connecting the plurality of regulation loads to one of the plurality of clock lines according to the number of logic circuits, in the plurality of logic circuits, connected to the plurality of clock lines.

2. The clock distributing circuit for a programmable logic device according to claim 1, wherein the plurality of second programmable connector elements are provided on the clock line provided close to the plurality of logic circuits.

3. The clock distributing circuit for a programmable logic device according to claim 1, wherein the plurality of second programmable connector elements are provided on the clock line in its connection sites separate from connection sites of the plurality of logic circuits on the clock line.

4. The clock distributing circuit for a programmable logic device according to claim 1, wherein the plurality of regulation loads are such that a plurality of loads different from each other in load capacity are connected onto a single clock line.

5. The clock distributing circuit for a programmable logic device according to claim 4, wherein the plurality of regulation loads comprise a first regulation load having the same capacity as the plurality of logic circuits combined therewith and a second regulation load having twice larger capacity than the plurality of logic circuits to be combined therewith.

* * * * *

UNITED STATES PATENT AND TRADEMARK OFFICE
CERTIFICATE OF CORRECTION

PATENT NO. : 6,538,489 B2
DATED : March 25, 2003
INVENTOR(S) : Hirotaka Nakano

It is certified that error appears in the above-identified patent and that said Letters Patent is hereby corrected as shown below:

Column 5,
Line 29, delete "MOSPETs" insert -- MOSFETs --

Column 7,
Line 40, delete "10." insert -- 10, --

Column 8,
Line 53, Table 4, delete "25a    92" insert -- 25a    82 --;
Line 55, delete "31b    93" insert -- 31b    83 --

Signed and Sealed this

Twenty-sixth Day of August, 2003

JAMES E. ROGAN
*Director of the United States Patent and Trademark Office*